(12) United States Patent
Price

(10) Patent No.: US 8,254,405 B2
(45) Date of Patent: Aug. 28, 2012

(54) METHOD AND TRANSMITTER FOR TRANSMITTING A SIGNAL IN A TIME SLOT OF A CHANNEL COMPRISING A PLURALITY OF TIME SLOTS EMPLOYING A REFERENCE RAMP PATTERN

(75) Inventor: Donal Price, Saffron Walden (GB)

(73) Assignee: ICERA Inc., Wilmington, DE (US)

( * ) Notice: Subject to any disclaimer, the term of this patent is extended or adjusted under 35 U.S.C. 154(b) by 310 days.

(21) Appl. No.: 12/703,319

(22) Filed: Feb. 10, 2010

(65) Prior Publication Data

US 2010/0202421 A1 Aug. 12, 2010

(30) Foreign Application Priority Data

Feb. 12, 2009 (GB) .................................. 0902348.2

(51) Int. Cl.
*H04L 12/28* (2006.01)
(52) U.S. Cl. ........................................................ 370/431
(58) Field of Classification Search .......... 370/431–463; 708/800, 801, 845, 852
See application file for complete search history.

(56) References Cited

U.S. PATENT DOCUMENTS

2008/0045165 A1 2/2008 Huang et al.
2010/0298035 A1* 11/2010 Beamish et al. ............... 455/571

FOREIGN PATENT DOCUMENTS

| WO | 2006117562 A1 | 11/2006 |
| WO | 2008031454 A1 | 3/2008 |
| WO | 2009019541 A1 | 2/2009 |

OTHER PUBLICATIONS

Patents Act 1977: Search Report under Section 17(5); www.ipo.gov.uk; 6 pages; Nov. 30, 2009.

* cited by examiner

*Primary Examiner* — Chi Pham
*Assistant Examiner* — Fan Ng

(57) ABSTRACT

A method, program and apparatus for transmitting a signal in a time slot of a channel comprising a plurality of time slots. Using a transmitter having a processor and a power amplifier, the method comprises: retrieving a reference ramp pattern from a memory; determining an output power level for the slot from a plurality of possible output power levels, each requiring a respective corresponding ramp pattern; executing software on the processor to apply a scaling function to the reference ramp pattern in dependence on the determined output power level, thus generating a scaled ramp pattern corresponding to the pattern required for that determined level; supplying the scaled ramp pattern to a control input of the power amplifier, to control the gain of the power amplifier during the time slot; and using the power amplifier, controlled according to the scaled ramp pattern, to transmit the signal in the time slot.

37 Claims, 2 Drawing Sheets

Figure 1:
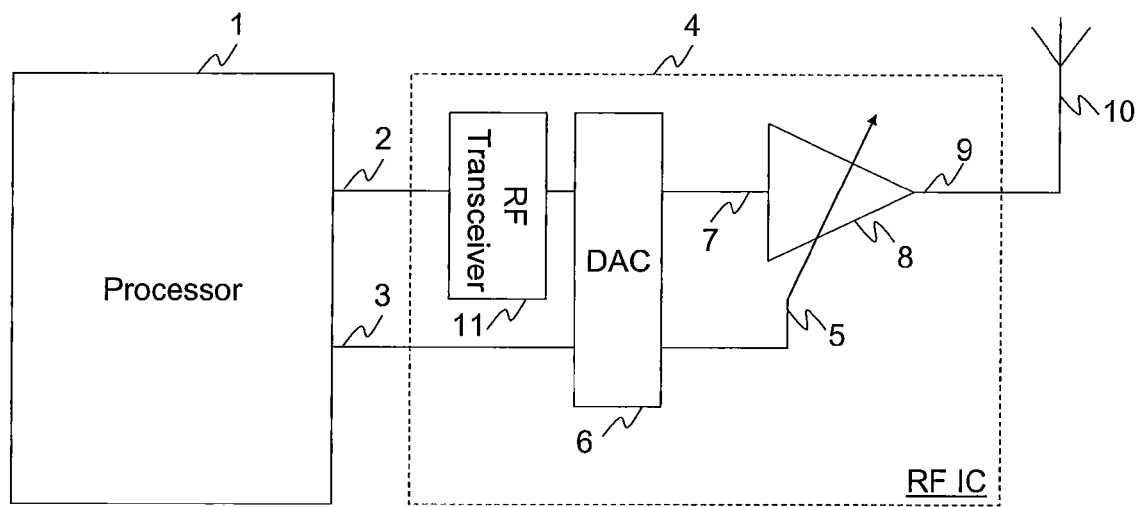

METHOD AND TRANSMITTER FOR
TRANSMITTING A SIGNAL IN A TIME SLOT
OF A CHANNEL COMPRISING A
PLURALITY OF TIME SLOTS EMPLOYING A
REFERENCE RAMP PATTERN

CROSS-REFERENCE TO RELATED APPLICATION

This application claims the benefit of GB Application No. 0902348.2, filed on Feb. 12, 2009, entitled "TRANSMITTING SIGNALS," commonly assigned with this application and incorporated herein by reference in its entirety.

TECHNICAL FIELD

This application is directed, in general, to the ramping of a power amplifier for transmission in a communication system.

BACKGROUND

Global System for Mobile communications (GSM) is a Time Division Multiple Access (TDMA) system, whereby users are separated by different timeslots. This requires radio transmitters to continually switch between off and on states. The transients associated with switching cause radio energy to be emitted on frequencies beyond the channel that is allocated to the user, causing interference to other users and degrading the overall performance of the network. In order to minimise these emissions, the shape of the transient is typically controlled in the time domain via a gain control input to the power amplifier (PA). This process is known as ramping. The shapes of the ramps need to be adjusted so that strict specifications on power-versus-time (PvT) and switching spectra are satisfied at all power levels.

Similar considerations may apply to any communication system in which different signals are transmitted on the same physical channel but at different time slots, e.g., Time Division Duplex (TDD) systems.

In the field of wireless communications, and particularly wireless cellular communications, there has been increasing interest in recent years in the idea of moving more of the functions of the transceiver into software. A transceiver with a tendency towards software implementation is sometimes referred to as a software modem, or "soft modem". The principle behind software modem is to perform a significant portion of the signal processing and other functionality required for the wireless communications in a generic, programmable, reconfigurable processor, rather than in dedicated hardware.

SUMMARY

According to one aspect of the present disclosure, there is provided a method of transmitting a signal in a time slot of a channel comprising a plurality of time slots, using a transmitter having a processor and a power amplifier. In one embodiment, the method includes: retrieving a reference ramp pattern from a memory; determining an output power level for the slot from a plurality of possible output power levels, each requiring a respective corresponding ramp pattern; executing software on the processor to apply a scaling function to the reference ramp pattern in dependence on the determined output power level, thus generating a scaled ramp pattern corresponding to the pattern required for that determined level; supplying the scaled ramp pattern to a control input of the power amplifier, to control the gain of the power amplifier during the time slot; and using the power amplifier, controlled according to the scaled ramp pattern, to transmit the signal in the time slot.

According to another aspect of the present disclosure, there is provided a transmitter for transmitting a signal in a time slot of a channel comprising a plurality of time slots. In one embodiment, the transmitter includes: a power amplifier having a signal output operatively coupled to an antenna for transmission of the signal; a processor having a signal output operatively coupled to a signal input of the power amplifier and having a control output operatively coupled to a gain control input of the power amplifier; a memory storing a reference ramp pattern, the memory being operatively coupled to the processor; wherein the processor is programmed to: determine an output power level for the slot from a plurality of possible output power levels, each requiring a respective corresponding ramp pattern; retrieve the reference ramp pattern from the memory; apply a scaling function to the reference ramp pattern in dependence on the determined output power level, thus generating a scaled ramp pattern corresponding to the ramp pattern required for that determined level; supply the scaled ramp pattern to the control input of the power amplifier to control the gain of the power amplifier during the time slot; and to supply the signal from its signal output to the signal input of the power amplifier, to transmit the signal in the time slot.

According to yet another aspect of the present disclosure, there is provided computer program product for transmitting a signal in a time slot of a channel comprising a plurality of time slots, using a transmitter having a processor and a power amplifier, the program comprising code configured so as when executed on the processor to perform the steps of any method disclosed herein.

According to still another aspect of the present disclosure, there is provided a wireless user terminal comprising a corresponding transmitter.

BRIEF DESCRIPTION

Figure 2:
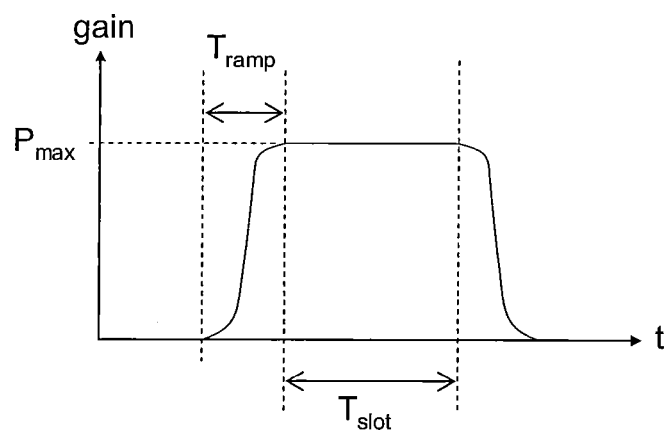
Figure 3:
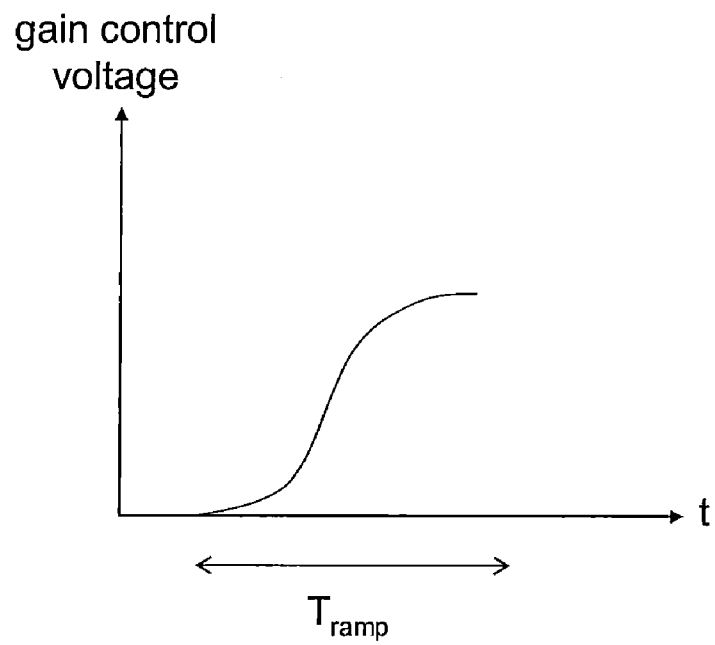
Figure 4:
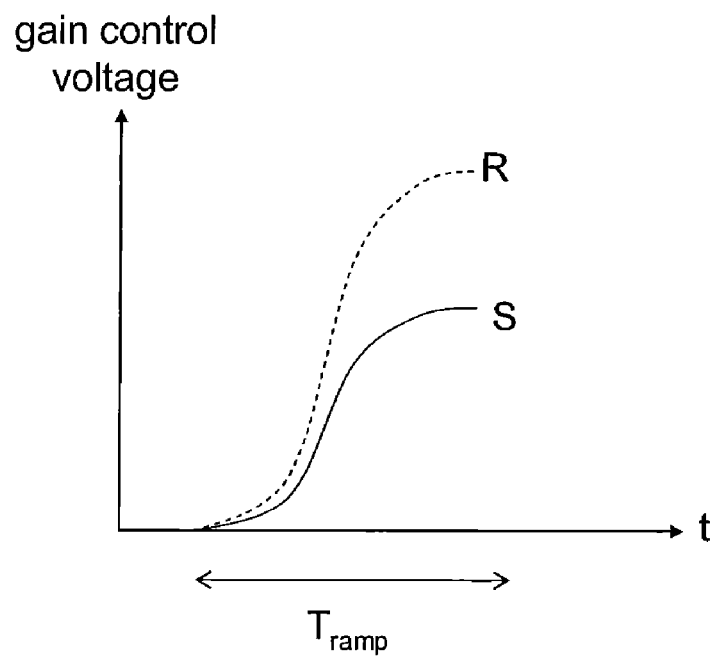

Reference is now made to the following descriptions taken in conjunction with the accompanying drawings, in which:

FIG. 1 is a schematic block diagram of a transmitter;
FIG. 2 shows schematically a variation in PA gain over a time slot;
FIG. 3 shows schematically a PA gain over a ramping up time; and
FIG. 4 shows schematically a PA ramp control signal over time.

DETAILED DESCRIPTION

One possible application of the soft modem principle is to control the ramping of the power amplifier (PA) using software. Common techniques for ramp generating may involve synthesizing a waveform in the baseband processor and converting this to analog form through a Digital to Analog Converter (DAC) for output to the PA. However, a major difficulty is generating ramp patterns that work over a wide range of PA output levels. Typically, the baseband processor stores multiple ramp patterns across the range of operating powers, but this is complex and leads to particular problems if the designer wishes to "tweak" the ramps at a later stage, since a large number of parameters need to be adjusted. Current soft implementations are therefore not in fact very flexible, contrary to the soft modem "philosophy".

This disclosure provides a more flexible and less cumbersome PA ramping technique. The disclosed ramp scaling has the advantageous effect that a single ramp pattern can be used for a relatively large range of output power levels. This is in contrast with previous soft implementations, which as mentioned require many different ramp patterns for different output power levels, which is problematic because it is time consuming if a designer wishes to adjust the profiles at a later date. It is also wasteful of memory space. But because the present disclosure applies a scaling function to a ramp pattern, in software, over a range of power levels, then the ramping pattern can be more easily updated and use less memory space.

In fact, surprisingly, in some embodiments only a single ramp pattern may need to be stored whilst still ensuring that the strict specifications for the power vs. time profile (PvT) and switching spectra are satisfied. Thus in one embodiment, the retrieval of a reference ramp pattern comprises retrieving the same reference ramp pattern irrespective of the output power level.

In further embodiments, a transmitter may be configured to operate in a plurality of different modes each corresponding to a different respective RAT, and the retrieval may comprise retrieving a selected one of a plurality of different reference ramp patterns available from the memory depending on the mode in which the transmitter is operating. Alternatively or additionally, the application of a scaling function may comprise applying a selected one of a plurality of different scaling functions depending on the mode in which the transmitter is operating.

Thus in one particular advantage associated with embodiments of the present disclosure, different ramping can be readily and flexibly applied for different modes corresponding to different RATs—including the possibility of a different scaling for different modes. For example, the application of a scaling function may comprise applying an additive scaling function for a first of the modes and a multiplicative scaling function for a second of the modes. The application of the scaling function may comprise subtracting a correction term before the scaling by the multiplicative function and adding the correction term again after the scaling by the multiplicative function. The first mode may be an EDGE mode and the second mode may be a GMSK mode.

In further embodiments, the supplying of the scaled ramp pattern to the control input of the power amplifier may comprise converting the scaled ramp pattern into an analog voltage profile. The time slot may be a slot of a time division duplex system. The time slot may be a slot of a time division multiple access system. The transmission may be wireless. For example, the transmission may be over a wireless cellular network.

An advantage of a soft modem type system is that it can be programmed and potentially reprogrammed to handle different protocols, algorithms, functions, radio access technologies and the like. For example, conventionally different radio access technologies would require different dedicated hardware to be included on a phone or other wireless terminal, and a terminal adapted to handle multiple radio access technologies or "multimode" terminal would have to include different sets of dedicated hardware. This problem can be solved by software modem techniques, in which the differences in communicating according to different RATs are handled in software. The processor could be programmed to handle both 2G and 3G cellular standards, including for example perhaps one or more of the GSM, UMTS, High Speed Downlink Packet Access (HSDPA), High Speed Uplink Packet Access (HSUPA), and 3GPP Long Term Evolution (LTE) standards.

Alternatively or additionally, the use of software modem techniques may allow a manufacturer, distributor or vendor to buy a batch of generic or "standard agnostic" processors and then program them according to different radio standards and technologies for different customers or purposes. A soft modem could also be updated easily and inexpensively by reprogramming it to handle new or different technologies. The different embodiments disclosed herein provide an improved technique for the soft generation of PA ramp control patterns. Those skilled in the art to which this application relates will appreciate that other and further additions, deletions, substitutions and modifications may be made to the described embodiments.

FIG. 1 illustrates schematically some of the components of an example of a soft-modem type transmitter, that may be used in a wireless communication network such as a cellular network. For example, the transmitter may be a user terminal such as a mobile phone or other portable terminal. The transmitter comprises a processor 1, at least one antenna 10, and a Radio Frequency (RF) Integrated Circuit (IC) 4 connected therebetween. The RF IC 4 comprises an RF transceiver 11, a digital to analog converter (DAC) 6 and a variable power amplifier 8. The transmitter also comprises a memory (not shown), which could be internal or external to the processor 1.

In one embodiment, the processor used is made by Icera and sold under the trade name Livanto®. Such a chip has a specialized processor platform described for example in WO2006/117562.

A digital signal output 2 of the processor 1 is coupled to a digital input of the RF transceiver 11, and a corresponding digital output of the RF transceiver 11 is coupled to a first digital input of the DAC 6. A digital control output 3 of the processor 1 is coupled to a second digital input of the DAC 6. A first analog output of the DAC 6, corresponding to the first digital input, is coupled to the signal input 7 of the power amplifier (PA) 5. A second analog output of the DAC 6, corresponding to the first digital input, is coupled to a gain control input 5 of the PA 8. The amplified signal output 9 of the PA 8 is coupled to the antenna 10.

As will be familiar to a person skilled in the art, the RF transceiver 11 will typically comprise various stages not shown in detail, such as filter stages, modulation stages, filters for upconversion, and additional amplifiers. The system may also comprise a receive path for receiving signals. Preferably, the transmitter may be configured as a soft baseband modem. That is, on the receive side, all the radio functionality from receiving RF signals from the antenna up to and including mixing down to baseband is implemented in dedicated hardware. Similarly, on the transmit side, all the functionality from mixing up from baseband to outputting RF signals to the antenna is implemented in dedicated hardware. However, all functionality in the baseband domain is implemented in software executed by the processor 1.

In operation, the processor 1 generates a digital signal for transmission over the wireless communication network, which it outputs from its digital signal output 2 via the transceiver 11 to the first digital input of the DAC 6. The DAC 6 converts this digital signal received at its first input into an analog signal, which it outputs from its first analog output to the signal input 7 of the PA 8. The PA 8 outputs the signal from its signal output 9 for transmission via antenna 10, with its power amplified in dependence on a gain control voltage input at its control input 5.

To control the gain of the PA 8, the processor 1 also generates a digital control profile for controlling the gain of the PA 8, which it outputs from its digital control output 3 to the second digital input of the DAC 6. The DAC 6 converts this digital pattern received at its second input into an analog voltage, which it outputs from its second analog output to the gain control input 5 of the PA 8.

As illustrated schematically in FIG. 2, the transmitter transmits the signal during a time slot of period $T_{slot}$. In the case of time division multiple access, as in GSM, the time slot corresponds to a period in which the transmitter switches on for a particular user's transmission. At the end of the slot it switches off again.

Immediately prior to the slot, the PA 8 is controlled by the processor 1 to ramp up its gain (and therefore power) during an initial ramp-up time $T_{ramp}$, up to a peak level corresponding to the maximum output power $P_{max}$. Similarly, the PA is controlled by the processor 1 to ramp down again immediately following the end of the slot.

As illustrated schematically in FIG. 3, to control the ramp up, the processor 1 generates and outputs a ramp pattern which when converted to analog produces a gain control voltage profile over time for input to the gain control input 5 of the PA 8. Similarly, the processor generates a ramp control pattern to control the ramp down at the end of the time slot. Thus the gain is ramped up by an up-ramp pattern, held constant over the course of the timeslot $T_{slot}$, then ramped down again by a down-ramp pattern. The generation of the up and down ramp patterns by the processor 1 will be discussed in further detail below.

Note that FIGS. 2 and 3 are purely schematic. Their shape is not intended to be representative of any actual ramping profile (although such shape is not necessarily excluded).

The required ramp pattern will depend on the power output level for the slot. By "power output level", it is meant an overall measure of the output power for the slot, rather than a measure of the specific power profile at each instance in time. This overall measure could be the maximum power $P_{max}$ or a measure of the average power over the slot.

As mentioned, in order to meet strict PvT and switching spectrum specifications, previous soft solutions have required the storage of many different ramp patterns for different possible output levels. Another possible solution would be to partition the ramp shaping between the baseband processor and hardware radio chip, with the baseband processor generating a ramp at a particular level and the radio chip applying a scaling factor that is appropriate to the power. This will simplify the baseband implementation, but require additional digital logic in the radio transceiver subsystem. Further, the fact that the solution is "part hard" means it will still not be as flexible as it could be, and therefore again is not entirely in keeping with the soft modem philosophy.

Preferably a more elegant soft solution can be found. To achieve this, prior knowledge of how a PA responds to the ramping voltage can be used to derive an algorithm that can generate a ramp for a particular power using a single template. An example of this is now described.

Before transmission, the processor 1 determines the desired output power level for the slot. The desired output power may be derived by higher layer radio link control software which aims to maintain a particular quality of service on the uplink whilst minimizing interference to other users in the network. This power level will then be converted to a peak voltage for the ramp waveform to reach. This conversion is performed by the radio driver software, using curves of PA power versus voltage curves that are calibrated in the factory. Further corrections are then applied to compensate for temperature and frequency effects (the gain of many components in the transmitter gain vary with temperature and frequency).

The transmitter also has a "reference" (or "template") ramp pattern stored in memory. This reference ramp pattern is not itself directly used to produce a gain control voltage, but if it was converted to analog would correspond to gain control voltage profile R over time, as illustrated schematically in FIG. 4. Instead, the reference ramp pattern provides a "generating basis" for a gain control voltage profile. The processor 1 retrieves the reference ramp pattern from memory and applies a scaling function to it, dependent on the power output level, thus generating a scaled ramp pattern which when converted to analog produces a scaled gain control voltage profile S over time, as also illustrated schematically in FIG. 4. This scaled gain control voltage profile S is input to the gain control input 5 of the PA 8, in order to control the gain and therefore power of the PA 8 during transmission of the relevant signal in the time slot $T_{slot}$.

This ramp scaling has the advantageous effect that a single ramp profile can be stored and used for a relatively large range of output power levels. In fact, surprisingly, it has been found that using the present disclosure, only a single ramp pattern need be stored for all possible output power levels, whilst still ensuring that the strict specifications for the power vs. time profile (PvT) and switching spectra are satisfied.

This is in contrast with previous soft implementations, which as mentioned require many different ramp patterns for different output power levels. This is problematic because if a designer wishes to 'tweak' the profiles at a later date, it is very time consuming. It is also wasteful of memory space.

Note that FIG. 4 is purely schematic. Its shape is not intended to be representative of any actual ramping profile (although such shape is not necessarily excluded).

In the following example, a dual-mode GSM transmitter will be considered which is operable in either a GMSK mode or an EDGE mode. In this embodiment, the transmitter stores and calculates ramp control voltages for a GSM PA in both the GMSK and EDGE modes.

For each mode a single reference ramp pattern is stored, which provides a 'generating basis' for all transmitter output powers. A scaling function is then applied in software, which adjusts the peak level of the ramp to produce the desired power whilst ensuring that specifications for the PvT and switching spectra are satisfied. The scaling function differs for GMSK and EDGE, accounting for the different responses of PAs in those two modes.

The solution makes use of the fact that, for a given input level, the output power of a GSM PA is typically related to the gain control voltage in the two modes as follows:
EDGE: on a logarithmic scale, the power is proportional to the gain control voltage.
GMSK: on a logarithmic scale, the power is proportional to the logarithm of the gain control voltage.

The solution also makes use of the fact that if, given a suitable ramp profile that meets PvT and switching spectra at maximum power, the ramp profile is adjusted so that the shape of the PvT trace in the logarithmic domain is constant and only its peak level moves with input power, then the specifications for PvT and switching spectra will be met at all power levels.

The scheme involves a single reference ramp profile being generated a priori. As mentioned, this is may be achieved by generating a suitable ramp profile that meets PvT and switching spectra at maximum power. A skilled RF engineer or technician will be capable of generating such a profile. This profile is likely to be platform-dependent but, once generated, will generate the ramps for all output powers, and no other characterization parameters are required.

The scaling of the ramp involves two steps:
i) Determine the PA control voltage required to produce the desired output power. This process will typically involve looking up or interpolating the control voltage from a calibration table of DAC word versus PA output power.

ii) Use the peak PA voltage to scale the reference ramp profile in either an additive sense (EDGE) or multiplicative sense (GMSK).

The ramp scaling schemes for the two modes are:

EDGE: The reference ramp pattern is adjusted by adding a delta that accounts for the difference between the desired power and that obtained with an un-scaled ramp waveform.

GMSK: The reference ramp pattern is adjusted by multiplying by a factor that accounts for the difference between the desired power and that obtained with an unscaled ramp waveform. Additionally, a correction term is subtracted before the scaling and restored after the scaling; this term accounts for the fact that the PA response is not strictly logarithmic. This correction term is computed from the calibration data for the PA and requires no additional characterization of the PA.

Thus the above embodiment has the following advantages:

only a single ramp need be stored for all PA output powers;
ramp scaling is performed entirely in software within the baseband processor and requires no external functions;
it requires only a single, reference ramp profile to be characterized;
it removes need to save multiple ramp profiles in memory, reducing storage requirements;
it removes need to hardware ramp scaling, saving mixed signal electronics within the radio transceiver subsystem.

It will be appreciated that the above embodiments are described only by way of example. For instance, although the above has been described in terms of time slots corresponding to alternating transmission and reception in a time division multiple access system, it could alternatively or additionally apply to ramping of a power amplifier in a time division duplex system in which the different time slots correspond to alternate transmission and reception, or any system in which transmission is required in certain ones of a plurality of time slots or in which transmission is "bursty". Further, note that the term "scaling" or similar as used herein is not limited to multiplicative scaling, but can to refer to other transformations including multiplicative scaling and/or additive scaling. Further, although the above has been described with reference to a certain partitioning of functionality between a baseband processor and an RF IC, solutions where the some of the RF/IF stages are not implemented by dedicated hardware are also envisaged. Where stages are implemented in hardware then these need not necessarily be implemented on an RF IC or any particular platform. Any other processor platforms may also be used. Other applications and configurations of the invention may be apparent to the person skilled in the art given the disclosure herein. The scope of the invention is not limited by the described embodiments.

What is claimed is:

1. A method of transmitting a signal in a time slot of a channel comprising a plurality of time slots, using a transmitter having a processor and a power amplifier, the method comprising:

retrieving a reference ramp pattern from a memory;
determining an output power level for the slot from a plurality of possible output power levels, each requiring a respective corresponding required ramp pattern, wherein the retrieving includes retrieving the same reference ramp pattern irrespective of the output power level;
executing software on the processor to apply a scaling function to the reference ramp pattern in dependence on the determined output power level, thus generating a scaled ramp pattern corresponding to the required ramp pattern for that determined level;
supplying the scaled ramp pattern to a control input of the power amplifier, to control the gain of the power amplifier during the time slot; and
using said power amplifier, controlled according to the scaled ramp pattern, to transmit the signal in said time slot.

2. A method according to claim 1, wherein the transmitter is configured to operate in a plurality of different modes each corresponding to a different respective radio access technology, and said retrieval comprises retrieving a selected one of a plurality of different reference ramp patterns available from said memory depending on the mode in which the transmitter is operating.

3. A method according to claim 1, wherein the transmitter is configured to operate in a plurality of different modes each corresponding to a different respective radio access technology, and said application of a scaling function comprises applying a selected one of a plurality of different scaling functions depending on the mode in which the transmitter is operating.

4. A method according to claim 3, wherein the application of a scaling function comprises applying an additive scaling function for a first of said modes and a multiplicative scaling function for a second of said modes.

5. A method according to claim 4, wherein the application of the scaling function comprises subtracting a correction term before the scaling by the multiplicative function and adding the correction term again after the scaling by the multiplicative function.

6. A method according to claim 4, wherein the first mode is an EDGE mode and the second mode is a GMSK mode.

7. A method according to claim 1, wherein the supplying of the scaled ramp pattern to the control input of the power amplifier comprises converting the scaled ramp pattern into an analog voltage profile.

8. A method according to claim 1, wherein the time slot is a slot of a time division duplex system.

9. A method according to claim 1, wherein the time slot is a slot of a time division multiple access system.

10. A method according to claim 1, wherein the transmission is wireless.

11. A method according to claim 10, wherein the transmission is over a wireless cellular network.

12. A transmitter for transmitting a signal in a time slot of a channel comprising a plurality of time slots, the transmitter comprising:

a power amplifier having a signal output operatively coupled to an antenna for transmission of the signal;
a processor having a signal output operatively coupled to a signal input of the power amplifier and having a control output operatively coupled to a gain control input of the power amplifier; and
a memory storing a reference ramp pattern, the memory being operatively coupled to the processor;
wherein the processor is programmed to: determine an output power level for the slot from a plurality of possible output power levels, each requiring a respective corresponding required ramp pattern; retrieve the reference ramp pattern from the memory, wherein the same reference ramp pattern is retrieved irrespective of the output power level; apply a scaling function to the reference ramp pattern in dependence on the determined output power level, thus generating a scaled ramp pattern corresponding to the required ramp pattern for that determined level; supply the scaled ramp pattern to the control input of the power amplifier to control the gain of the power amplifier during the time slot; and to supply the signal from its signal output to the signal input of the power amplifier, to transmit the signal in said time slot.

13. A transmitter according to claim 12, wherein the transmitter is configured to operate in a plurality of different modes each corresponding to a different respective radio access technology, and the processor is programmed to retrieve a selected one of a plurality of different reference ramp patterns available from said memory depending on the mode in which the transmitter is operating.

14. A transmitter according to any of claims 13, wherein the transmitter is configured to operate in a plurality of different modes each corresponding to a different respective radio access technology, and the processor is configured to apply a selected one of a plurality of different scaling functions depending on the mode in which the transmitter is operating.

15. A transmitter according to claim 14, wherein the processor is programmed to apply an additive scaling function for a first of said modes and a multiplicative scaling function for a second of said modes.

16. A transmitter according to claim 15, wherein the processor is programmed to subtract a correction term before scaling by the multiplicative function and to add the correction term again after scaling by the multiplicative function.

17. A transmitter according to claim 15, wherein the first mode is an EDGE mode and the second mode is a GMSK mode.

18. A transmitter according to any of claims 12 wherein the transmitter is configured to operate in a plurality of different modes each corresponding to a different respective radio access technology, and the processor is configured to apply a selected one of a plurality of different scaling functions depending on the mode in which the transmitter is operating.

19. A transmitter according to claim 18, wherein the processor is programmed to apply an additive scaling function for a first of said modes and a multiplicative scaling function for a second of said modes.

20. A transmitter according to claim 19, wherein the processor is programmed to subtract a correction term before scaling by the multiplicative function and to add the correction term again after scaling by the multiplicative function.

21. A transmitter according to claim 19, wherein the first mode is an EDGE mode and the second mode is a GMSK mode.

22. A transmitter according to any of claims 12 wherein the transmitter is configured to operate in a plurality of different modes each corresponding to a different respective radio access technology, and the processor is configured to apply a selected one of a plurality of different scaling functions depending on the mode in which the transmitter is operating.

23. A transmitter according to claim 22, wherein the processor is programmed to apply an additive scaling function for a first of said modes and a multiplicative scaling function for a second of said modes.

24. A transmitter according to claim 23, wherein the processor is programmed to subtract a correction term before scaling by the multiplicative function and to add the correction term again after scaling by the multiplicative function.

25. A transmitter according to claim 23, wherein the first mode is an EDGE mode and the second mode is a GMSK mode.

26. A transmitter according to claim 12, comprising a digital-to-analog converter by which the signal output of the processor is coupled to the signal input of the power amplifier, such that supplying of the scaled ramp pattern to the control input of the power amplifier comprises converting the scaled ramp pattern into an analog voltage profile.

27. A transmitter according to claim 12, wherein the time slot is a slot of a time division duplex system.

28. A transmitter according to claim 12, wherein the time slot is a slot of a time division multiple access system.

29. A transmitter according to claim 12, wherein the processor configured to transmit over a wireless cellular network.

30. A computer program product for transmitting a signal in a time slot of a channel comprising a plurality of time slots, using a transmitter having a processor and a power amplifier, the computer program product embodied as a series of operating instructions on a non-transitory computer readable medium and configured so as when executed on the processor to perform the following steps:

retrieving a reference ramp pattern from a memory;
determining an output power level for the slot from a plurality of possible output power levels, each requiring a respective corresponding required ramp pattern, wherein the retrieving includes retrieving the same reference ramp pattern irrespective of the output power level;
executing software on the processor to apply a scaling function to the reference ramp pattern in dependence on the determined output power level, thus generating a scaled ramp pattern corresponding to the required ramp pattern for that determined level;
supplying the scaled ramp pattern to a control input of the power amplifier, to control the gain of the power amplifier during the time slot; and
using said power amplifier, controlled according to the scaled ramp pattern, to transmit the signal in said time slot.

31. A wireless user terminal comprising a transmitter for transmitting a signal in a time slot of a channel comprising a plurality of time slots, the transmitter comprising:

a power amplifier having a signal output operatively coupled to an antenna for transmission of the signal;
a processor having a signal output operatively coupled to a signal input of the power amplifier and having a control output operatively coupled to a gain control input of the power amplifier; and
a memory storing a reference ramp pattern, the memory being operatively coupled to the processor;
wherein the processor is programmed to: determine an output power level for the slot from a plurality of possible output power levels, each requiring a respective corresponding required ramp pattern; retrieve the reference ramp pattern from the memory; apply a scaling function to the reference ramp pattern in dependence on the determined output power level, thus generating a scaled ramp pattern corresponding to the required ramp pattern for that determined level; supply the scaled ramp pattern to the control input of the power amplifier to control the gain of the power amplifier during the time slot; and to supply the signal from its signal output to the signal input of the power amplifier, to transmit the signal in said time slot.

32. A method of transmitting a signal in a time slot of a channel comprising a plurality of time slots, using a transmitter having a processor and a power amplifier, the method comprising:

retrieving a reference ramp pattern from a memory;

determining an output power level for the slot from a plurality of possible output power levels, each requiring a respective corresponding required ramp pattern;

executing software on the processor to apply a scaling function to the reference ramp pattern in dependence on the determined output power level, thus generating a scaled ramp pattern corresponding to the required ramp pattern for that determined level;

supplying the scaled ramp pattern to a control input of the power amplifier, to control the gain of the power amplifier during the time slot; and using said power amplifier, controlled according to the scaled ramp pattern, to transmit the signal in said time slot, wherein the transmitter is configured to operate in a plurality of different modes each corresponding to a different respective radio access technology, and the retrieving includes retrieving a selected one of a plurality of different reference ramp patterns available from the memory depending on the mode in which the transmitter is operating.

33. A method of transmitting a signal in a time slot of a channel comprising a plurality of time slots, using a transmitter having a processor and a power amplifier, the method comprising:

retrieving a reference ramp pattern from a memory;

determining an output power level for the slot from a plurality of possible output power levels, each requiring a respective corresponding required ramp pattern;

executing software on the processor to apply a scaling function to the reference ramp pattern in dependence on the determined output power level, thus generating a scaled ramp pattern corresponding to the required ramp pattern for that determined level;

supplying the scaled ramp pattern to a control input of the power amplifier, to control the gain of the power amplifier during the time slot; and using said power amplifier, controlled according to the scaled ramp pattern, to transmit the signal in the time slot, wherein the transmitter is configured to operate in a plurality of different modes each corresponding to a different respective radio access technology, and the application of a scaling function comprises applying a selected one of a plurality of different scaling functions depending on the mode in which the transmitter is operating.

34. A transmitter for transmitting a signal in a time slot of a channel comprising a plurality of time slots, the transmitter comprising:

a power amplifier having a signal output operatively coupled to an antenna for transmission of the signal;

a processor having a signal output operatively coupled to a signal input of the power amplifier and having a control output operatively coupled to a gain control input of the power amplifier; and a memory storing a reference ramp pattern, the memory being operatively coupled to the processor;

wherein the processor is programmed to: determine an output power level for the slot from a plurality of possible output power levels, each requiring a respective corresponding required ramp pattern; retrieve the reference ramp pattern from the memory; apply a scaling function to the reference ramp pattern in dependence on the determined output power level, thus generating a scaled ramp pattern corresponding to the required ramp pattern for that determined level; supply the scaled ramp pattern to the control input of the power amplifier to control the gain of the power amplifier during the time slot; and to supply the signal from its signal output to the signal input of the power amplifier, to transmit the signal in said time slot, wherein the transmitter is configured to operate in a plurality of different modes each corresponding to a different respective radio access technology, and the processor is configured to apply a selected one of a plurality of different scaling functions depending on the mode in which the transmitter is operating.

35. A computer program product for transmitting a signal in a time slot of a channel comprising a plurality of time slots, using a transmitter having a processor and a power amplifier, the computer program product embodied as a series of operating instructions on a non-transitory computer readable medium and configured so as when executed on the processor to perform the following steps:

retrieving a reference ramp pattern from a memory;

determining an output power level for the slot from a plurality of possible output power levels, each requiring a respective corresponding required ramp pattern;

executing software on the processor to apply a scaling function to the reference ramp pattern in dependence on the determined output power level, thus generating a scaled ramp pattern corresponding to the required ramp pattern for that determined level;

supplying the scaled ramp pattern to a control input of the power amplifier, to control the gain of the power amplifier during the time slot; and using said power amplifier, controlled according to the scaled ramp pattern, to transmit the signal in said time slot, wherein the transmitter is configured to operate in a plurality of different modes each corresponding to a different respective radio access technology, and the retrieving includes retrieving a selected one of a plurality of different reference ramp patterns available from the memory depending on the mode in which the transmitter is operating.

36. A computer program product for transmitting a signal in a time slot of a channel comprising a plurality of time slots, using a transmitter having a processor and a power amplifier, the computer program product embodied as a series of operating instructions on a non-transitory computer readable medium and configured so as when executed on the processor to perform the following steps:

retrieving a reference ramp pattern from a memory;

determining an output power level for the slot from a plurality of possible output power levels, each requiring a respective corresponding required ramp pattern;

executing software on the processor to apply a scaling function to the reference ramp pattern in dependence on the determined output power level, thus generating a scaled ramp pattern corresponding to the required ramp pattern for that determined level;

supplying the scaled ramp pattern to a control input of the power amplifier, to control the gain of the power amplifier during the time slot; and using said power amplifier, controlled according to the scaled ramp pattern, to transmit the signal in the time slot, wherein the transmitter is configured to operate in a plurality of different modes each corresponding to a different respective radio access technology, and the application of a scaling function comprises applying a selected one of a plurality of different scaling functions depending on the mode in which the transmitter is operating.

37. A wireless user terminal comprising a transmitter for transmitting a signal in a time slot of a channel comprising a plurality of time slots, the transmitter comprising:

a power amplifier having a signal output operatively coupled to an antenna for transmission of the signal;

a processor having a signal output operatively coupled to a signal input of the power amplifier and having a control output operatively coupled to a gain control input of the power amplifier; and a memory storing a reference ramp pattern, the memory being operatively coupled to the processor;

wherein the processor is programmed to: determine an output power level for the slot from a plurality of possible output power levels, each requiring a respective corresponding required ramp pattern; retrieve the reference ramp pattern from the memory; apply a scaling function to the reference ramp pattern in dependence on the determined output power level, thus generating a scaled ramp pattern corresponding to the required ramp pattern for that determined level; supply the scaled ramp pattern to the control input of the power amplifier to control the gain of the power amplifier during the time slot; and to supply the signal from its signal output to the signal input of the power amplifier, to transmit the signal in said time slot, wherein the transmitter is configured to operate in a plurality of different modes each corresponding to a different respective radio access technology, and the processor is configured to apply a selected one of a plurality of different scaling functions depending on the mode in which the transmitter is operating.

\* \* \* \* \*